United States Patent [19]

Rollett et al.

[11] 3,936,777

[45] Feb. 3, 1976

[54] ARRANGEMENTS FOR SIMULATING INDUCTANCE AND FILTER NETWORKS INCORPORATING SUCH IMPROVEMENTS

[75] Inventors: John Mortimer Rollett; David Richard Wise, both of London, England

[73] Assignee: The Post Office, London, England

[22] Filed: Sept. 27, 1974

[21] Appl. No.: 509,968

[30] Foreign Application Priority Data
Oct. 1, 1973  United Kingdom............... 45860/73

[52] U.S. Cl............................... 333/80 R; 330/109
[51] Int. Cl.² ......................................... H03H 11/00
[58] Field of Search......... 333/80 R, 80 T; 328/167; 330/107, 109

[56] References Cited
UNITED STATES PATENTS

| | | |
|---|---|---|
| 3,375,451 | 3/1968 | Borelli et al.......................... 328/167 |
| 3,473,142 | 10/1969 | Herrero .......................... 330/109 X |
| 3,512,102 | 5/1970 | Kubach............................ 330/109 X |
| 3,517,342 | 6/1970 | Orchard et al................ 333/80 R X |
| 3,715,680 | 2/1973 | Fleischer............................ 330/107 |
| 3,767,861 | 10/1973 | Dimmer ............................ 333/80 T |

*Primary Examiner*—Paul L. Gensler
*Attorney, Agent, or Firm*—Kemon, Palmer & Estabrook

[57] ABSTRACT

A filter network particularly suitable for construction in micro-electronic circuitry for application in telephony systems is formed by simulating inductance in a circuit arrangement incorporating only resistance, capacitance and amplifying elements. The symmetry of the circuit arrangement and coupling into the filter network simplifies fabrication and reduces the number of amplifiers previously required to perform similar filter functions. The filter networks may be built up by coupling a chain of circuit arrangements each including two unity gain amplifiers having a series resistor/capacitor feedback network and a non-inductive element interconnecting the two amplifier feedback networks.

7 Claims, 23 Drawing Figures

ARRANGEMENTS FOR SIMULATING INDUCTANCE AND FILTER NETWORKS INCORPORATING SUCH IMPROVEMENTS

The invention relates to filter networks. In particular the invention relates to filter networks incorporating active devices and used in low-pass and band-pass filter network arrangements.

It is often undesirable to employ coils in micro-electronic circuitry, and for this reason circuits using only resistive, capacitive and active components have been developed to simulate inductances. In low-pass and other filter networks it is often necessary to use "floating inductors," that is, inductors with terminals which are not grounded.

It is a particular object of the invention to provide an active circuit employing resistors, capacitors and amplifiers to simulate inductors and to arrange such circuits so that in use they act as floating inductors, or as floating and grounded inductors, in filter networks.

Networks employing four operational amplifiers are known as active networks to simulate pure floating inductance. With the present invention the active network employs only two substantially unity-gain amplifiers to provide a floating lossy inductance. The unity-gain amplifiers used with the present invention may be provided by high-gain operational amplifiers with one hundred per cent negative feed-back to give an overall gain of unity. The amplifiers may alternatively be voltage follower circuits such as an emitter-follower or compound emitter-follower circuit.

According to a first aspect of the present invention there is provided a circuit arrangement for a filter network comprising a first and second amplifier element each having an overall gain substantially equal to unity and each having an input and an output interconnected by way of a series network including a resistive and a capacitive impedance element and a junction point between said elements and wherein the product of the values or resistance and capacitance of the elements in the series network for the first and second amplifiers is equal, the arrangement being symmetrical in terms of components about a first non-inductive coupling element interconnecting the junction points in the series networks of the first and second amplifiers.

Preferably, in some applications of the invention, to improve the Q factor of the circuit, the first non-inductive coupling element consists of a resistor having an impedance substantially greater than the sum of the impedance of the resistive elements in the series networks. The input to the circuit may be applied by way of an input terminal direct to the input of one of the amplifiers or by way of one of the elements in one of the series networks. The circuit may simulate a lossy floating inductance or by replacing resistors by capacitors and vice versa, a "lossy $1/s^2$ impedance" element, where s is the complex frequency variable and the losses take the form of series and/or parallel capacitance rather than resistance as with the floating inductances.

According to a second aspect of the present invention there is provided a filter network having an input port and an output port and including a circuit arrangement according to the first aspect of the invention which circuit arrangement is symmetrically coupled between said input port, which is arranged to be coupled to a signal source, and said output port which is arranged to be coupled to a load impedance and wherein there is provided a second and third non-inductive element connected across the input port and output port respectively of the filter network and wherein a fourth noninductive element is connected in series between an input terminal of the input port and an output terminal of the output port of the filter network.

Preferably the second, third and fourth non-inductive elements are capacitors arranged and dimensioned so that the filter network provides a low-pass filter network.

If required two circuit arrangements according to the first aspect of the present invention may be interconnected by making one of the amplifiers of one of the circuit arrangements common (i.e. shared with the other circuit arrangement).

The invention will now be described, by way of example, with reference the accompanying diagrammatic drawings in which:-

Figure 1:
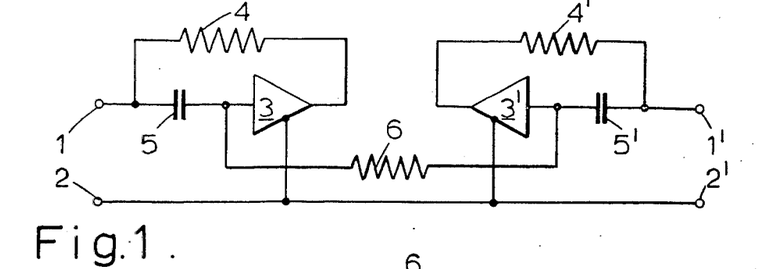
FIG. 1 shows a circuit arrangement of a floating lossy inductance.
Figure 2:
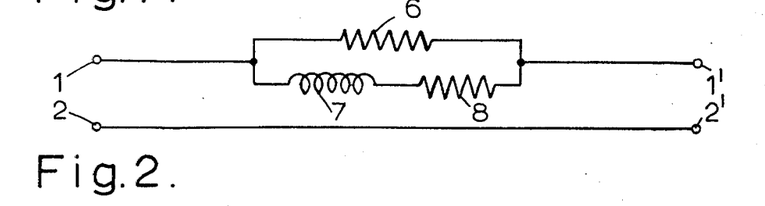
FIG. 2 is the equivalent circuit of FIG. 1.

Referring now to the drawings two preferred embodiments will be described and these embodiments will be applied to a number of networks to illustrate the applications of the invention. FIG. 1 shows a symmetrical circuit arrangement acting as a floating lossy inductance. Each half of the arrangement consists of terminals 1 and 2, an amplifier 3, a resistor 4, and a capacitor 5. To indicate the components on the right hand side of the symmetrical arrangement a prime has been added to the reference numerals. The junctions between the capacitor 5 and the input to the amplifier 3 for both halves of the arrangement are interconnected by way of a resistor 6. FIG. 2 shows the equivalent circuit of FIG. 1 in which the interconnecting resistor 6 is in parallel with a lossy inductance illustrated by the inductor 7 and a resistor 8 in series. The amplifiers 3 have an overall gain which is substantially equal to unity. The amplifiers have an negligibly low input admittance and negligibly low output impedance. Preferably the amplifiers consist of high-gain operational amplifiers with 100 percent negative feed-back or, they may consist of emitter or compound emitter follower circuits. For the arrangement to act as a floating lossy inductance it is necessary that:-

$$R_1C_1 = R_2C_2 \quad (1)$$

where:
$R_1$ is the resistance of the resistor 4
$R_2$ is the resistance of the resistor $4^1$
$C_1$ is the capacitance of the capacitor 5
$C_2$ is the capacitance of the capacitor $5^1$ If, referring to FIG. 2, the inductance 7 has a value $L_1$ the resistor 8 has a resistance $R_3$ and the interconnecting resistor 6 has a resistance $R_0$ then:

$$L_1 = \frac{R_0 R_1 C_1}{1-(R_1+R_2)/R_0} \quad (2)$$

and $$R_3 = \frac{R_1+R_2}{1-(R_1+R_2)/R_0} \quad (3)$$

If $R_0$ is chosen to be much greater than $(R_1 + R_2)$ then the equivalent inductance 7 and series resistance 8 given approximately by:-

$$L_1 = R_0 R_1 C_1 \quad (4)$$
$$R_3 = R_1 + R_2 \quad (5)$$

It is desirable, in general, to reduce the series resistance $R_3$ and increase the shunt resistance $R_0$ as far as possible, in order to reduce the losses of the lossy inductance and to raise its effective 'Q' factor. It is evident that this may be achieved by reducing $R_1$ and $R_2$ and increasing $R_0$ as far as practicable.

Figure 3:
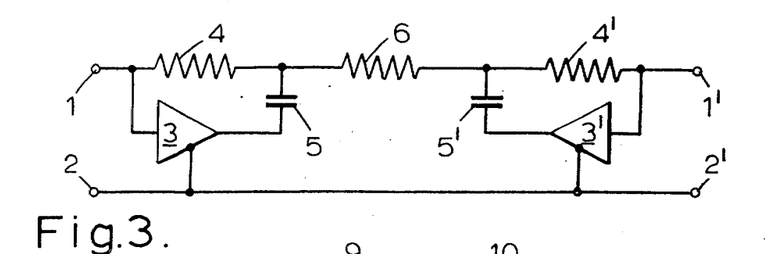
FIG. 3 shows a second circuit arrangement simulating a floating lossy inductance.
Figure 4:
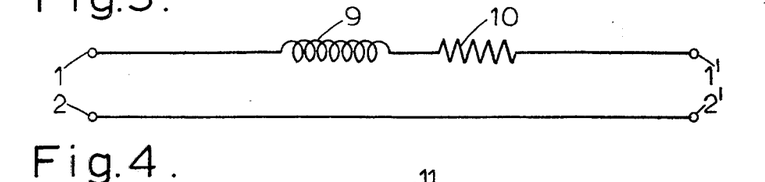
FIG. 4 shows the equivalent circuit of FIG. 3.

The circuit of another form of the invention is given in FIG. 3. The arrangement of FIG. 3 is again symmetrical about the interconnecting resistor 6 and each half of the arrangement comprises an amplifier, a resistor and a capacitor which are given the same reference numerals as for FIG. 1 with the indication of the right-hand half being again shown by the inclusion of a prime. In FIG. 3 the interconnecting resistor 6 is coupled between the junctions between the resistors 4 and the capacitor 5 and the resistor 4' and the capacitor 5'. The equivalent circuit of FIG. 3 is shown in FIG. 4 which consists of an inductor 9 having an inductance $L_2$ and a resistor 10 having a resistance $R_4$ connected in series.

Providing the equation (1) holds for the arrangement of FIG. 3 the circuit behaves as a floating lossy inductance in which (referring to the equivalent circuit of FIG. 4):-

$$L_2 = R_0 R_1 C_1 \quad (6)$$
$$R_4 = R_0 + R_1 + R_2 \quad (7)$$

The two circuits of FIGS. 1 and 3 may be used to provide a floating inductance in circuits which are tolerant of an inductance with losses, or in circuits which have been specially designed for specific values of losses associated with floating inductances.

Figure 5:
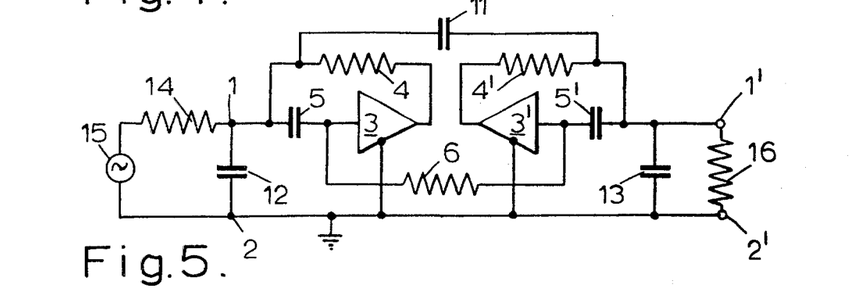
FIG. 5 is a circuit diagram of a low-pass filter incorporating the network of FIG. 1.
Figure 6:
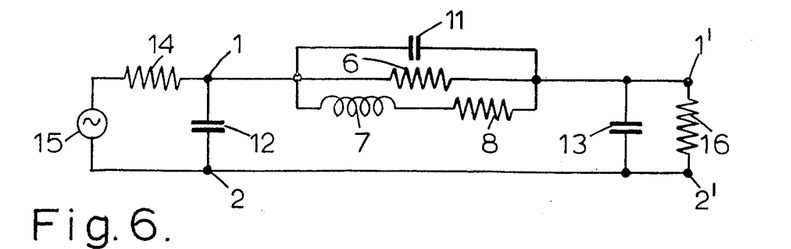
FIG. 6 shows the equivalent circuit of the filter network shown in FIG. 5.

One example of a filter network using the circuit of FIG. 1 is shown in FIG. 5, which shows a circuit suitable for a 'pseudo' elliptic third-order low pass filter. The equivalent circuit is shown in FIG. 6.

The low-pass filter shown in FIG. 5 comprises a lossy floating inductance as illustrated in FIG. 1 and having the same reference numerals, and with the addition of a capacitor 11 connected between the junctions between resistors 4 and 4' and capacitors 5 and 5' respectively. A capacitor 12 is connected across the input terminals 1 and 2 and a capacitor 13 is connected across the other terminals 1' and 2'. A resistor 14 couples the filter to a signal source 15 and a load resistor 16 is also connected across the terminals 1' and 2'.

The additional components added in FIG. 5 to the embodiment of the invention shown in FIG. 1 have the following values:

| Capacitor 11 | = | $C_4$ |
| Capacitor 12 | = | $C_3$ |
| Capacitor 13 | = | $C_5$ |
| Resistor 14 | = | $R_s$ |
| Resistor 16 | = | $R_L$ |

The values of the elements of the filter network should preferably be calculated to allow for the effects of the losses associated with the inductance. The resistors $R_s$ and $R_L$ are the source and load resistance.

Figure 7:
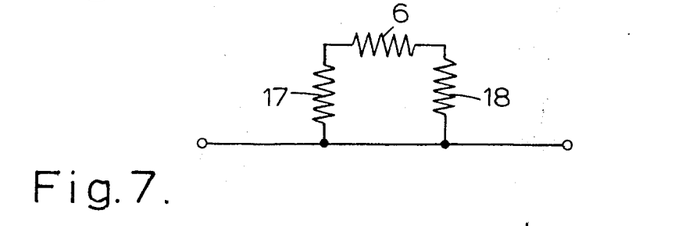
FIG. 7 shows a $\pi$ network of resistances.
Figure 8:
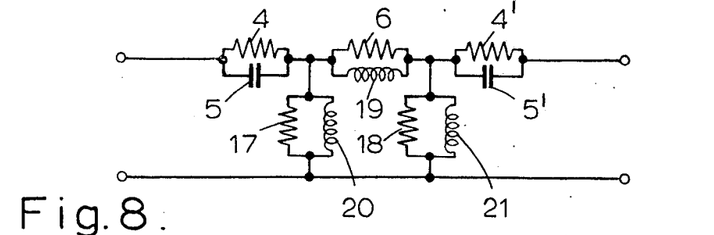
FIG. 8 shows a lossy inductor network corresponding to the resistor network of FIG. 7 using the active network of FIG. 1.
Figure 9:
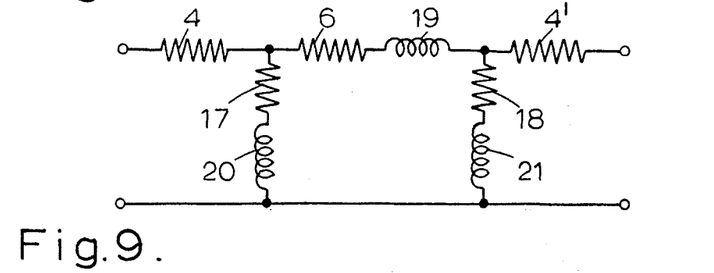
FIG. 9 shows an alternative lossy inductor network for FIG. 7 using the active network of FIG. 3.

Both the circuits described (FIGS. 1 and 3) may be used to turn networks of resistors into networks of lossy inductances, by connecting additional resistors to the terminals of resistor $R_0$, in either FIG. 1 or FIG. 3. For example, as shown in FIG. 7 if additional grounded resistors 17 and 18 having values $R_5$ and $R_6$ respectively are connected to the terminals of $R_0$ in FIG. 1 to give the $\pi$ network of resistors of FIG. 7, then the equivalent circuit of the resulting network is as shown in FIG. 8. Similarly, if the modification indicated in FIG. 7 is introduced into FIG. 3, the equivalent circuit of the result is as shown in FIG. 9. The lossy inductors formed in the corresponding network shown in FIG. 8 are in the network of inductors 19, 20, 21. These inductors have a value corresponding to $R_0R_1C_1$, $R_5R_1C_1$ and $R_6R_1C_1$ respectively. These inductors are also similarly referenced in FIG. 9.

Figure 10:
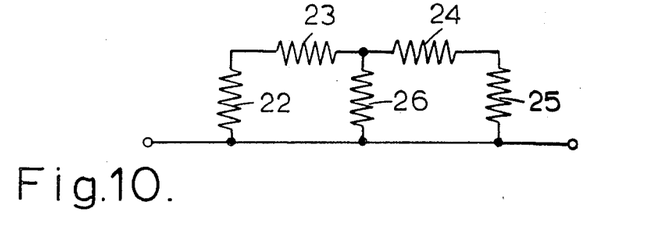
FIG. 10 shows a further resistor network.

More complicated networks of resistors can be turned into networks of lossy inductances by using three or more unity-gain amplifiers, each associated with one resistor and one capacitor. An example, is given in FIG. 10 of a network of five resistors. The circuit of FIG. 10 is a bridge network consisting of resistors 22, 23, 24 and 25 and a resistor 26 connecting the junctions between the resistive arms 22 and 25 and arms 23 and 24. By means of the arrangement of FIG. 3 and by utilising three amplifier stages to provide lossy inductance the circuit of FIG. 10 may be turned into five lossy inductances. The complete circuit is shown in FIG. 11 and an exact equivalent circuit in FIG. 12.

Figure 11:
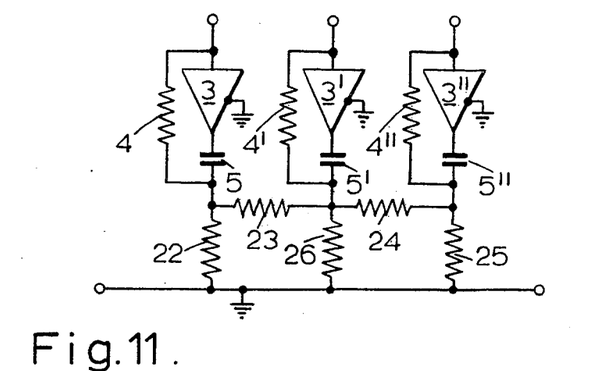
FIG. 11 shows a circuit according to the invention incorporating the resistor network of FIG. 10.
Figure 12:
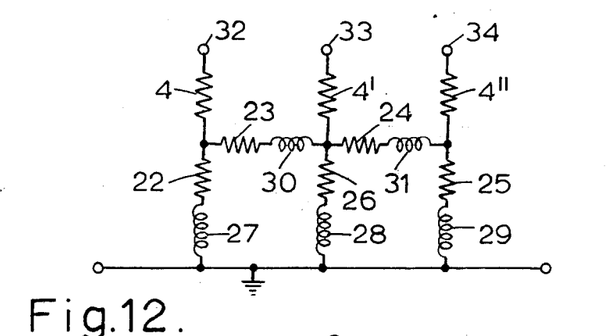
FIG. 12 shows the equivalent circuit of FIG. 11.

To differentiate between the three arms of the network shown in FIG. 11 the integers of the basic circuit arrangment shown in FIG. 1 have been given a single, or double prime after the reference numberal. The equivalent circuit shown in FIG. 12 includes inductors 27, 28, 29, 30 and 31 interconnected by way of the resistors 22, 23, 24, 25 and 26 and connected to terminals 32, 33, and 34 by way of resistors 4, 4', 4" respectively. The resistors 22, 23, 24, 25 and 26 have the values $R_aR_bR_dR_eR_c$ respectively and the inductors 27, 28, 29, 30 and 31 as shown in FIG. 12 have the values:- $R_aR_1C_1$; $R_cR_1C_1$; $R_eR_1C_1$; $R_bR_1C_1$; and $R_dR_1C_1$; respectively.

Examples will now be given of filter networks incorporating the basic circuits of FIG. 3 and its derivatives, such as that shown in FIG. 11. Similar networks can be built, by analogy, incorporating the basic circuit of FIG. 1, and one such filter has already been shown in FIG. 5, with its equivalent circuit illustrated in FIG. 6.

Figure 13:
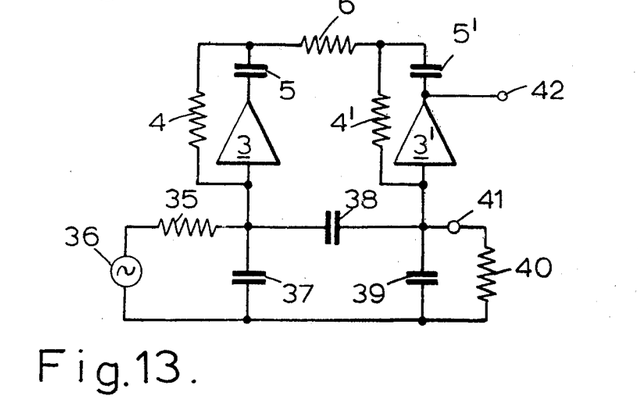
FIG. 13 shows a third-order "pseudo-elliptic" low-pass filter.

The circuit of FIG. 13 is suitable for realising a third-order "pseudo-elliptic" low-pass filter. The circuit of FIG. 13 consists of the basic arrangement of FIG. 3 together with a resistor 35 coupling an input frequency source 36 to a network of capacitors 37, 38, 39. A resistor 40 coupled across the capacitor 39 may be added if necessary. The output from the circuit may be taken either from an output terminal 41 or from an output terminal 42. It will be appreciated that as the output 42 is taken directly from the output of the operational amplifier or alternatively from the emitter-follower or similar circuit, it is especially suited for supplying power to the following circuit. It will also be appreciated that it effectively buffers the filter network from the following circuit so that variations in load impedance will not effect the filters wave-shaping properties. This fact is an additional advantage available in many circuits constructed with the basic circuit of FIG. 3.

The inclusion of the resistor 40 helps to reduce the sensitivity of the network, whether or not the output is taken from terminal 42.

It is worth noting at this point that a known circuit to provide a floating inductance would lead to a filter network with four amplifiers, and if an output buffered from the filter network were required, a total of five amplifiers would be necessary, rather than just the two in the present invention.

Figure 14:
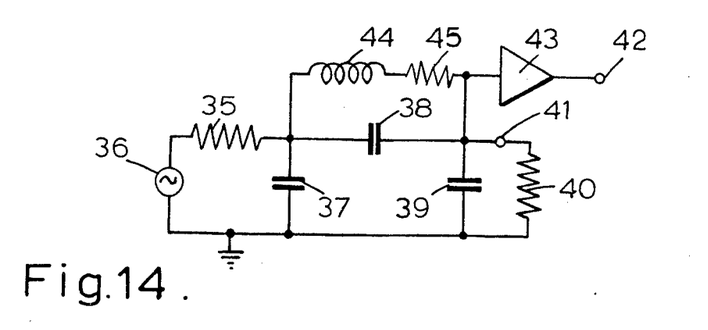
FIG. 14 is the equivalent circuit of FIG. 13.

The equivalent circuit of FIG. 13 is shown in FIG. 14. It includes a buffer amplifier 43 indicating the buffered output terminal 42. The equivalent circuit includes an inductor 44 in series with a resistor 45. The inductor 44 has a value substantially equal to $R_3R_1R_1$ and the resistor 45 has a value substantially equal to $(R_1 + R_2 + R_3)$.

Two specific examples of circuits according to FIG. 13 will now be given.

TABLE 1

| Resistors 4 and 4' | $= R_1 = R_2 = 5.477$ k$\Omega$ |
|---|---|
| Resistor 6 | $= R_3 = 10.95$ k$\Omega$ |
| Resistor 35 | $= R_4 = 10.0$ k$\Omega$ |
| Resistor 40 is omitted | |
| Capacitor 5 and 5'' | $= C_1 = C_2 = 44.62$ nF |
| Capacitor 37 | $= C_3 = 7.802$ nF |
| Capacitor 38 | $= C_4 = 213.7$ pF |
| Capacitor 39 | $= C_5 = 636.4$ pF |

With the value of components set out in Table 1 above there is produced a third-order low-pass filter with passband ripple of 1dB, a cut-off frequency of 3.4 kHz, and a stop-band discrimination of 30dB.

With the second embodiment of the circuit of FIG. 13 having component values as set out in Table 2 below there is produced a third-order low-pass filter to the same specification as above but with a lower sensitivity.

TABLE 2

| Resistor 4 and 4'' | $= R_1 = R_2\ 969.2\Omega$ |
|---|---|
| Resistor 6 | $= R_3 = 1938\Omega$ |
| Resistor 35 | $= R_4 = 30.0\Omega$ |
| Resistor 40 | $= R_5 = 118.4\Omega$ |
| Capacitor 5 and 5' $= C_1$ | $= C_2 = 965.9$ nF |
| Capacitor 37 | $= C_3 = 2.262$ nF |
| Capacitor 38 | $= C_4 = 312.1$ pF |
| Capacitor 39 | $= C_5 = 1.331$ nF |

Figure 15:
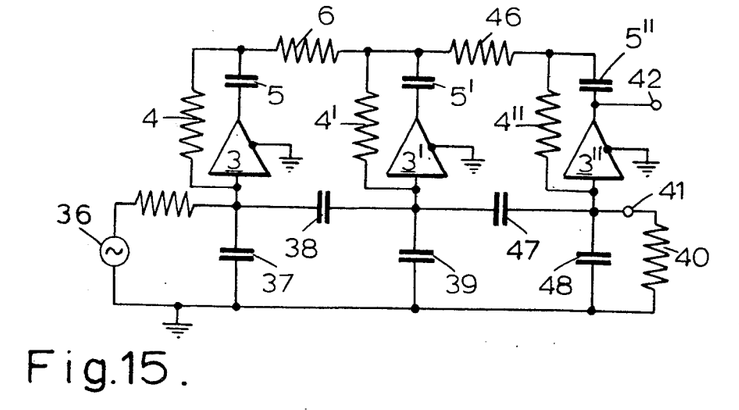
FIG. 15 shows a fifth-order "pseudo-elliptic" low-pass filter.
Figure 16:
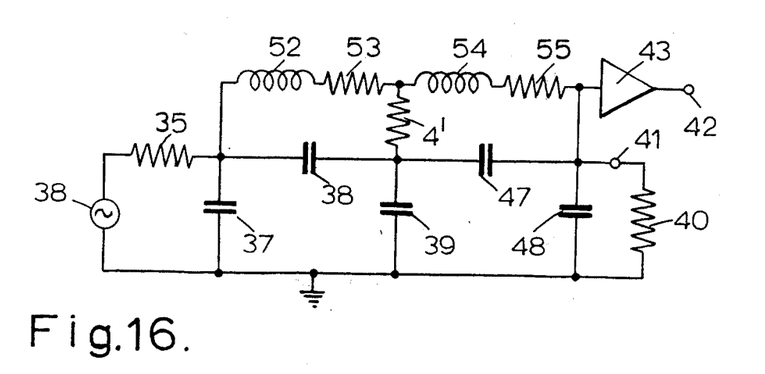
FIG. 16 is the equivalent circuit of FIG. 15.
Figure 17:
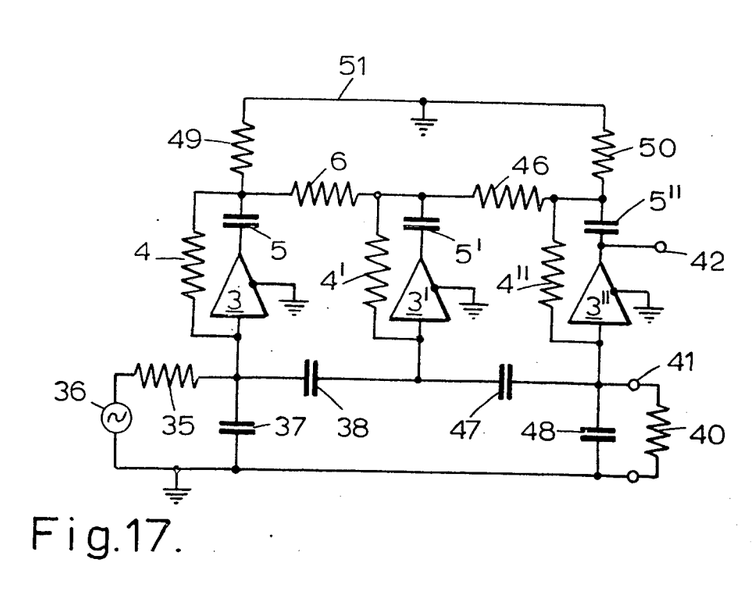
FIG. 17 shows a sixth-order "pseudo-elliptic" band-pass filter.
Figure 18:
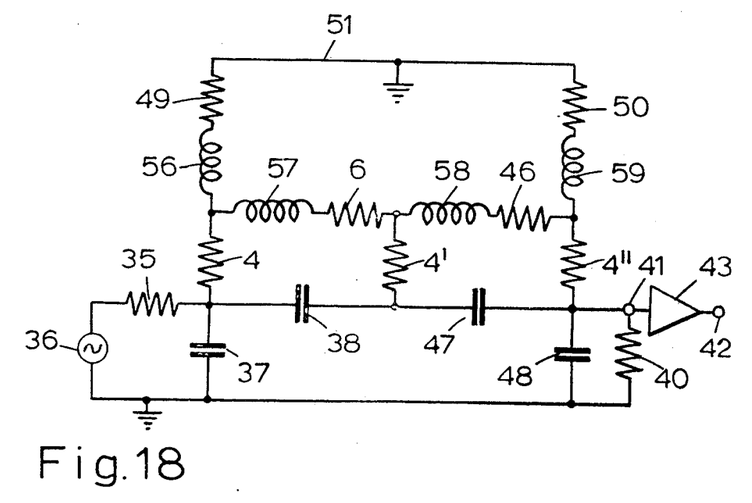
FIG. 18 is the equivalent circuit of FIG. 17.

By using the same constructional relationship as in FIG. 13 that is to say making the product of the values of the components 4 and 5 equal to that of 4' and 5' a fifth-order low-pass and a sixth-order band-pass "pseudo-elliptic" filter may be constructed in these cases illustrated in FIGS. 15 and 17 and with equivalent circuits illustrated in FIGS. 16 and 18 respectively. The product of the values of the components 4 and 5 is equal to the product of 4' and 5' and is also equal to the product of 4'' and 5''. The components of FIGS. 15 and 17 and the equivalent circuits of 16 and 18 have been given the same reference numerals as in previous circuit arrangements with the addition of a single or double prime to indicate succeeding stages in the filter. The circuit of FIG. 15 additionally includes a resistor 46, a capacitor 47 and a capacitor 48. The additional components in FIG. 17 consist of a resistor 46, the capacitor 47 and the capacitor 48 together with a pair of resistors 49 and 50 connected to a common earth 51., and capacitor 39 is omitted. In both circuits of FIG. 15 and 17 when the output is taken from the terminal 42 so as to be buffered by the amplifier the resistor 40 is optional. If the resistor 40 is included its presence reduces the sensitivity of the circuit which already has a low sensitivity.

Considering now the equivalent circuit in FIG. 16 this includes an inductor 52 in series with a resistor 53, and a further inductor 54 in series with a further resistor 55. The inductors 52 and 54 have values equal to $R_4R_1C_1$ and $R_5R_1C_1$ respectively. The resistors 53 and 55 have values equal to $(R_1 + R_4)$ and $(R_3 + R_5)$ respectively. To determine suitable component values it is preferable to use a computer to design the lossy filter. Approximate component values are available from tables which assume that the inductances 52 and 54 have infinite Q-factors.

The equivalent circuit of FIG. 17 is shown in FIG. 18 which includes the inductors 56, 57, 58 and 59 having the values $R_6R_1C_1, R_4R_1C_1, R_5R_1C_1,$ and $R_7R_1C_1$ respectively where: $R_6$ is the value of the resistor 49; $R_7$ is the value of the resistor 50; and $R_5$ is the value of the resistor 46.

Using known circuits for floating inductances a total of 7 amplifiers would be required to realise a buffered filter as shown in FIG. 17 whereas according to the present invention only 3 amplifiers are required.

Another method of building networks of lossy inductances is possible using the basic circuit of FIG. 3. Fundamentally the method consists of realising each inductance separately and then replacing pairs of unity-gain amplifiers which have their inputs joined by a single unity-gain amplifier. Thus the two separated networks of FIG. 19, each of which is similar to the circuit of FIG. 3 may be joined by considering the adjacent amplifiers as a single amplifier.

Figure 19:
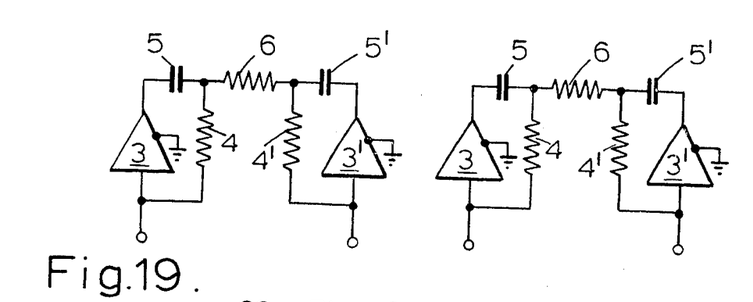
FIG. 19 shows two floating inductances according to the; invention.

The circuits shown in FIG. 19 are referenced with the component element values. The amplifiers each have an overall gain of unity. The values of the components are related by the following two expressions:-

$$R_2C_2 = R_1C_1 \quad \ldots\ldots\ldots\ldots\ldots(8)$$
$$R_4C_4 = R_3C_3 \quad \ldots\ldots\ldots\ldots\ldots(9)$$

Figure 20:
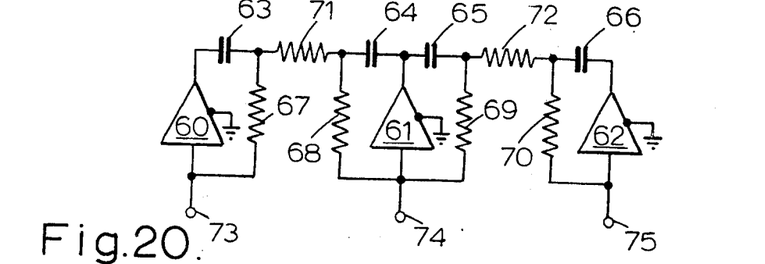
FIG. 20 shows a form of coupling between the two floating inductances of FIG. 19.
Figure 21:
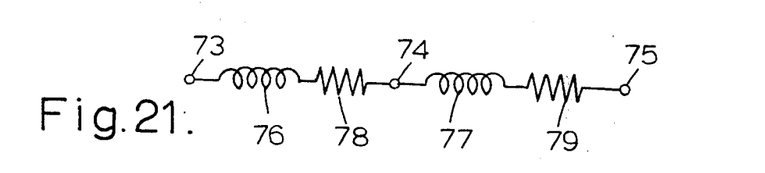
FIG. 21 is the equivalent circuit of FIG. 20.

The circuit shown in FIG. 20 has components also interrelated by equations (8) and (9) above. The arrangement comprises three amplifiers 60, 61 and 62 each having an overall gain substantially equal to unity and interconnected by capacitors 63, 64, 65 and 66 and by resistors 67, 68, 69, 70, 71 and 72 the arrangement is provided with terminal 73, 74 and 75. The equivalent circuit is shown in FIG. 21 in which the terminals 73, 74 and 75 are interconnected by a pair of series connected inductors 76 and 77 and a pair of resistors 78 and 79. The inductors 76 and 77 have values substantially equal to $R_5R_1C_1$ and $R_6R_3C_3$ respectively. The resistors 78 and 79 have the values $(R_1 + R_2 + R_5)$ and $R_3 + R_4 + R_6)$ respectively.

A network of this kind may be used in the fifth-order filter of FIG. 15 in place of the floating-inductance network shown there. It has the advantage of eliminating the resistor 4' in the equivalent circuit of FIG. 16 the values of resistors 53 and 55 are however increased. Similarly, if a network of similar kind is substituted in the circuit of FIG. 17, the resistors 4,4', 4" in the equivalent circuit are eliminated; the values of resistors 6, 46, 49 and 50 are then increased.

Figure 22:
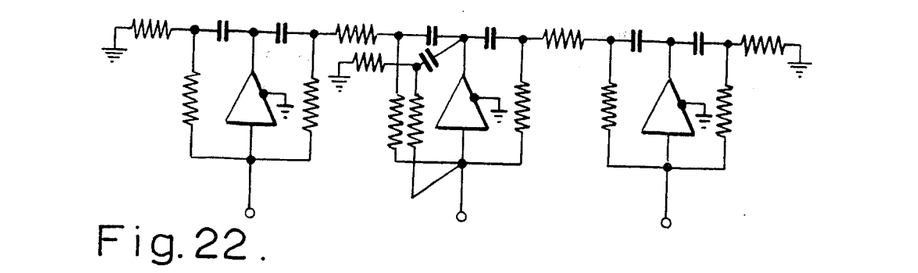
FIG. 22 shows a circuit to simulate a network of lossy inductances.
Figure 23:
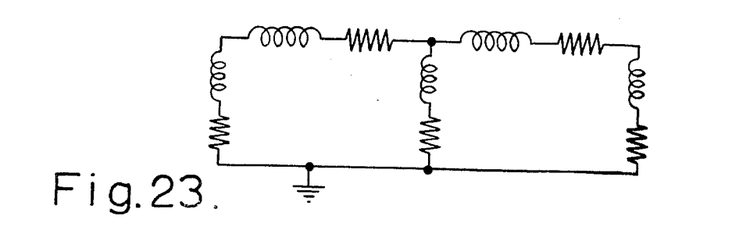
FIG. 23 is the equivalent circuit for FIG. 22.

FIG. 22 shows a further example of the method of deriving filter networks consisting of lossy inductances and FIG. 23 illustrates the equivalent circuit of FIG. 22. The principle of the method and the value of the elements can be determined from the previous description and examples referred to above.

It will be appreciated that the circuits of the present invention may be modified, by replacing the capacitors by resistors and the resistors by capacitors, so as to produce high-pass filters where in the above described cases low-pass filters were produced, and to produce band-stop filters where in the above band-pass filters are described. By replacing capacitors by resistors and vice-versa in the above described networks floating "lossy $1/s^2$ elements" are obtained or networks utilising such elements are produced. These floating lossy $1/s^2$ elements include an impedance proportional to $1/s^2$ where s is the complex frequency variable and the "losses" take the form of series and/or parallel capacitances rather than resistances as in the basic circuits described above. All the circuits of the invention are particularly suitable for use in telephone systems in which it is necessary to select or reject certain predetermined frequencies or ranges of frequencies from the telephony signals.

What we claim is:

1. In a filter network a circuit arrangement comprising a first and second amplifier element each having an overall gain substantially equal to unity and each having a single input and a single output interconnected by way of a first and a second series network respectively, each series network including a resistive impedance element and a capacitive impedance element and a first junction point between said resistive and said capacitive impedance elements and wherein the product of the values or resistance and capacitance of the elements in the series network for each of said first and second amplifiers is equal, a first non-inductive coupling element interconnecting the series networks of the first and second amplifiers, the circuit arrangement being a symmetrical mirror image in terms of components about said first non-inductive coupling element.

2. In a filter network as claimed in claim 1 a second junction point for each of said first and second series networks being provided respectively between said input to said first and said input to said second amplifier and said capacitive impedance elements of said first and the second series networks, said capacitive impedance elements being directly connected to said inputs respectively and wherein said second junction points are interconnected by a resistor forming said non-inductive coupling element.

3. In a filter network as claimed in claim 1 said first junction point of said first series network being interconnected by said first non-inductive coupling element to said first junction point of said second series network.

4. In a filter network according to claim 3 said first non-inductive coupling element being a capacitor and said resistive impedance element of said first and said second series network being connected to the output of said first and second amplifiers respectively.

5. In a filter network as claimed in claim 3 said first non-inductive coupling element being a resistor and said capacitive impedance element of said first and said second series network being connected to the output of said first and second amplifiers respectively.

6. In a filter network as claimed in claim 5 said resistor having a resistive impedance substantially greater than the sum of the resistive impedance of the resistive impedance elements in said first and the second series networks.

7. In a filter circuit as claimed in claim 5 each of said first and second amplifiers consisting of a high gain operational amplifier with one hundred percent negative feedback to produce said overall unity gain.

* * * * *